(12) United States Patent
Hill et al.

(10) Patent No.: US 6,314,039 B1
(45) Date of Patent: Nov. 6, 2001

(54) CHARACTERIZATION OF SENSE AMPLIFIERS

(75) Inventors: J. Michael Hill, Ft Collins; Jonathan E. Lachman, Fort Collins; Robert McFarland, Greeley, all of CO (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/578,968

(22) Filed: May 25, 2000

(51) Int. Cl.$^7$ ..................................................... G11C 7/00
(52) U.S. Cl. ......................... 365/207; 365/205; 365/201; 714/718; 714/726; 714/733; 714/742
(58) Field of Search ................................... 365/201, 205, 365/207; 711/718, 726, 733, 742

(56) References Cited

U.S. PATENT DOCUMENTS

| | | | |
|---|---|---|---|
| 5,434,821 | | 7/1995 | Watanabe et al. .................... 365/203 |
| 5,592,425 | * | 1/1997 | Neduva ................................. 365/201 |
| 5,835,436 | * | 11/1998 | Ooishi ............................... 365/230.03 |
| 6,006,347 | * | 12/1999 | Churchill et al. .................... 714/724 |
| 6,175,532 | * | 1/2001 | Ooishi ............................... 365/230.03 |

FOREIGN PATENT DOCUMENTS

| | | | |
|---|---|---|---|
| 403078186A | * | 4/1991 | (JP) . |
| 405081899A | * | 4/1993 | (JP) . |
| 09120698A | * | 5/1997 | (JP) . |

* cited by examiner

*Primary Examiner*—Viet Q. Nguyen

(57) ABSTRACT

A circuit and method characterizes a sense amplifier, such as the type utilized in computer memory systems. The sense amplifier characterization circuit comprises a sense amplifier having one or more inputs and an output, a BIT line connected to one of the one or more inputs of the sense amplifier, a register connected to the output of the sense amplifier; and control logic connected to the BIT line. Optionally, the register is further connected to the control logic, and the register is a scan register connectable to a tester. Preferably, the sense amplifier is a differential sense amplifier, and the circuit further comprises a complement BIT line connected to one of the one or more inputs of the sense amplifier. The method produces one or more signals like an output of a memory cell, operates one or more sense amplifier to produce one or more output states on the basis of the one or more signals, and records the one or more output states. Optionally, the method also records data related to the one or more signals. In one mode of operation, the method sets a voltage of the one or more signals like an output of a memory cell to be a static value during the operating step. In another mode of operation, the method sets a voltage of the one or more signals like an output of a memory cell to be alternating values during the operating step. The method further determines, on the basis of the one or more output states, whether the sense amplifier is acceptable, and if acceptable, the sense amplifier is utilized in a memory system.

20 Claims, 6 Drawing Sheets

US 6,314,039 B1

CHARACTERIZATION OF SENSE AMPLIFIERS

TECHNICAL FIELD

The invention relates to computer memory systems generally. More particularly, the invention relates to characterization, testing and verification of sense amplifiers for use in computer memory systems.

BACKGROUND ART

One of the key components affecting the speed of a memory system is the sense amplifier, which is a differential amplifier or comparator that reads output lines from a memory array. One of the key characteristics affecting the speed of a memory is the offset voltage of its sense amplifier. A large offset voltage limits the speed at which a memory system can operate because memory array output lines must slew to a sufficient extent to overcome the offset voltage. To design a fast memory system, a designer must be able to predict sense amplifier characteristics, such as offset voltage. Unfortunately, known techniques for characterizing the offset voltage of the sense amplifier are approximate and unsatisfactory. Known techniques include calculations based on the electrical characteristics of the electronic components of the sense amplifier or rough "rules of thumb."

SUMMARY OF INVENTION

In one respect, the invention is a circuit for characterizing a sense amplifier. The circuit comprises a sense amplifier having one or more inputs and an output, a BIT line connected to one of the one or more inputs of the sense amplifier, a register connected to the output of the sense amplifier; and control logic connected to the BIT line. Optionally, the register is further connected to the control logic, and the register is a scan register connectable to a tester. Preferably, the sense amplifier is a differential sense amplifier, and the circuit further comprises a complement BIT line connected to one of the one or more inputs of the sense amplifier.

In another respect, the invention is a system for characterizing a sense amplifier. The system comprises a means for amplifying one or more inputs to produce an output, a means, connected to one of the one or more inputs of the means for amplifying, for simulating an output of a memory array, a means for latching the output of the amplifying means; and a means for controlling the means for simulating. Optionally, the means for latching is further connected to the means for controlling, and the means for latching is a scan register connectable to a tester. Preferably, the system further comprises a means for simulating a complement output of a memory array. Preferably, the means for amplifying is a means for differentially amplifying two signals— the simulated output and the simulated complement output.

In yet another respect, the invention is a method for characterizing a sense amplifier. The method produces one or more signals like an output of a memory cell, operates one or more sense amplifier to produce one or more output states on the basis of the one or more signals, and records the one or more output states. Optionally, the method also records data related to the one or more signals. In one mode of operation, the method sets a voltage of the one or more signals like an output of a memory cell to be a static value during the operating step. In another mode of operation, the method sets a voltage of the one or more signals like an output of a memory cell to be alternating values during the operating step. The method further determines, on the basis of the one or more output states, whether the sense amplifier is acceptable, and if acceptable, the sense amplifier is utilized in a memory system.

In comparison to the prior art, certain embodiments of the invention are capable of achieving certain advantages, including the following:

(1) Accurate and extensive characterization of sense amplifiers, including their offset voltages, is possible.

(2) Alternate topologies, circuits and designs of sense amplifiers can be characterized.

(3) Aging and future drift of both the fabrication process making the sense amplifiers and the semiconductor devices containing the sense amplifiers can be simulated and tracked.

Those skilled in the art will appreciate these and other advantages and benefits of various embodiments of the invention upon reading the following detailed description of a preferred embodiment with reference to the below-listed drawings.

DETAILED DESCRIPTION OF A PREFERRED EMBODIMENT

Figure 1:
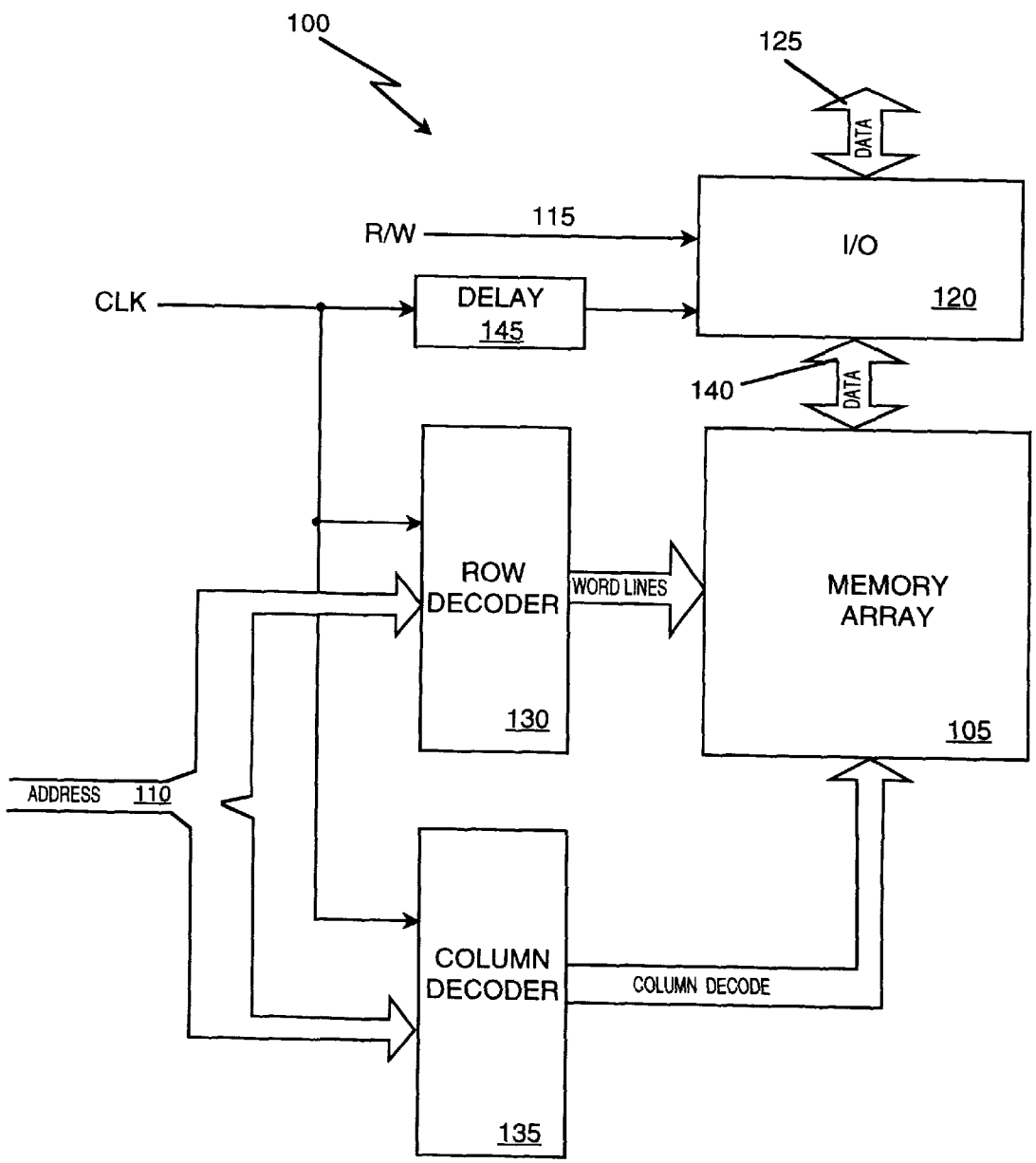
FIG. 1 is a block diagram of a computer memory system.

FIG. 1 is a block diagram of a memory system 100. The memory system 100 includes a memory array 105, each element of which is capable of storing one bit. An exemplary physical arrangement of the elements of the memory array 105 is a square grid. An exemplary size of the memory array 105 may be 4,096 bits by 4,096 bits, resulting in a total of 2 MB (megabytes) of capacity. If the contents of the memory array 105 are logically segmented into 64-bit words, then the square memory array 105 having a 2 MB capacity can be organized as 4,096 rows, where each row contains 64 words or columns, resulting in a total of 262,144 words. Each of the 262,144 words can be uniquely referenced by an 18-bit address. Twelve of the 18 address bits are used to specify one of the 4,096 rows in the memory array 105, and six of the 18 address bits are used to specify one of the 64 columns.

The memory system 100 may be part of a computer or other electronic device. The memory array 105 may be of the static or dynamic or other type. The memory system 100 may be physically packaged separately as a memory device per se or combined in an integrated package as a memory subsystem along with other subsystems, such as, for example as a cache memory subsystem of a microprocessor. The memory system 100 may be RAM (random access memory), ROM (read only memory), EPROM (electrically programmable ROM), EEPROM (erasable EPROM) or any other variety of memory. Furthermore, although the invention is preferably utilized in conjunction with a memory system, that need not be the case. The invention is generally useful with any system containing sense amplifiers, such as PLAs (programmable logic arrays) or long differential lines employing sense amplifiers to speed detection of signal conditions.

In operation, an address is placed on the address bus 110. The address on the address bus 110 references one word in a specific row-column location of the memory array 105. A read/write (RIW) line 115 is input to an I/O (input/output) module 120 and specifies whether the specific row-column location is to be read or written. When a writing operation takes place, a word is placed on the data bus 125, and the word is written by the I/O module 120 to the specified row-column of the memory array 105. When a reading operation takes place, the word stored at the specified row-column of the memory array 105 is sensed by the I/O module 120 and placed on the data bus 125.

The decoding of a memory address is performed by one or more decoders. Each decoder generally accepts as input N address lines and outputs $2^N$ "word" lines. In response to a particular state of the N address lines, a decoder sets exactly one of its word lines. That is, the word lines are in a one-hot condition. Each output word line corresponds to one of the $2^N$ possible states of the N address lines. In the computer memory system 100, under the size and geometry assumptions stated above, a row decoder 130 decodes twelve address lines to set one of 4,096 distinct word lines—one for each row of the memory array 105. Similarly, a column decoder 135 decodes six address lines to set one of 64 column decode lines that select a specified column of the memory array 105.

An address clock (CLK) 140 is provided to the row decoder 130 and the column decoder 135. That is, the signals on the address bus 110 are clock signals. The address clock 140 is also input to a delay element 145 before being supplied to the I/O module 120. The address clock 140 is delayed before reaching the I/O module 120 to allow time for row/column decoding and access to the memory array 105 before the contents of the memory array 105 are read from or written to the data bus 125.

Figure 2:
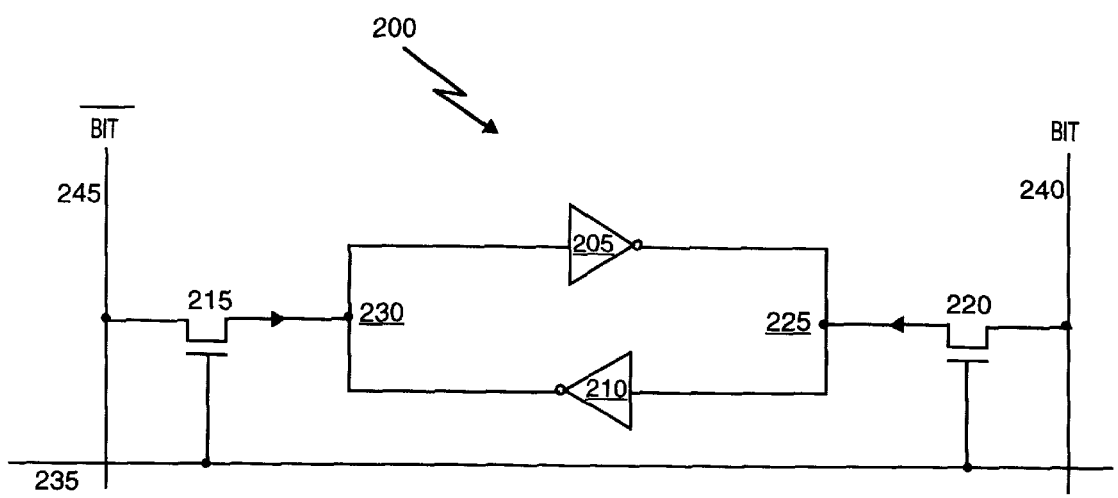
FIG. 2 is a circuit diagram of a static memory cell.

FIG. 2 is a circuit diagram of a static memory cell 200. If the memory array 105 is of the static type, then it comprises a cell 200 for each bit that it is capable of storing. The static memory cell 200 consists of two inverters 205 and 210 configured as a latch. In addition, the static memory cell 200 includes two NFETs (N-channel field effect transistors) 215 and 220. In one state, the cell 200 stores a "1", and a node 225 is "1" (or one or high or set), causing a node 230 to be "0" (or zero or low or clear) by operation of the inverter 210. The inverter 205 in turn results in the node 225 being set, completing a stable feedback loop. In another state, the cell stores a "0," when the node 225 is 0 and the node 230 is 1. When a word line 235 is asserted high, the NFETs 215 and 220 turn on, connecting the nodes 225 and 230 to a bit line 240 and a complement bit line 245, respectively. In the computer memory system 100, the bit line 240 and the complement bit line 245 are connected from the memory array 105 to the I/O module 120 via the internal data bus 140. Also, the word line 235 is one of the word lines from the row decoder 130 or the column decoder 135 or a logical combination of word lines from the row decoder 130 and the column decoder 135.

An internal data bus 140 connects between the memory array 105 and the I/O module 120. The width of the internal data bus 140 is typically twice the width of the data bus 125 (e.g., 64 bits), in which case both the bit lines and the complement bit lines of the constituent bits of one word are transferred between the memory array 105 and the I/O module 120. In an alternative arrangement, the width of the internal data bus 140 is twice the side dimension of the memory array 105 (e.g., 4,096) bits, and the column decoder is logically located between the memory array 105 and the I/O module 120. In this alternative arrangement, the column decoder selects which block of lines in the internal data bus 140 is to be operated upon.

Figure 3:
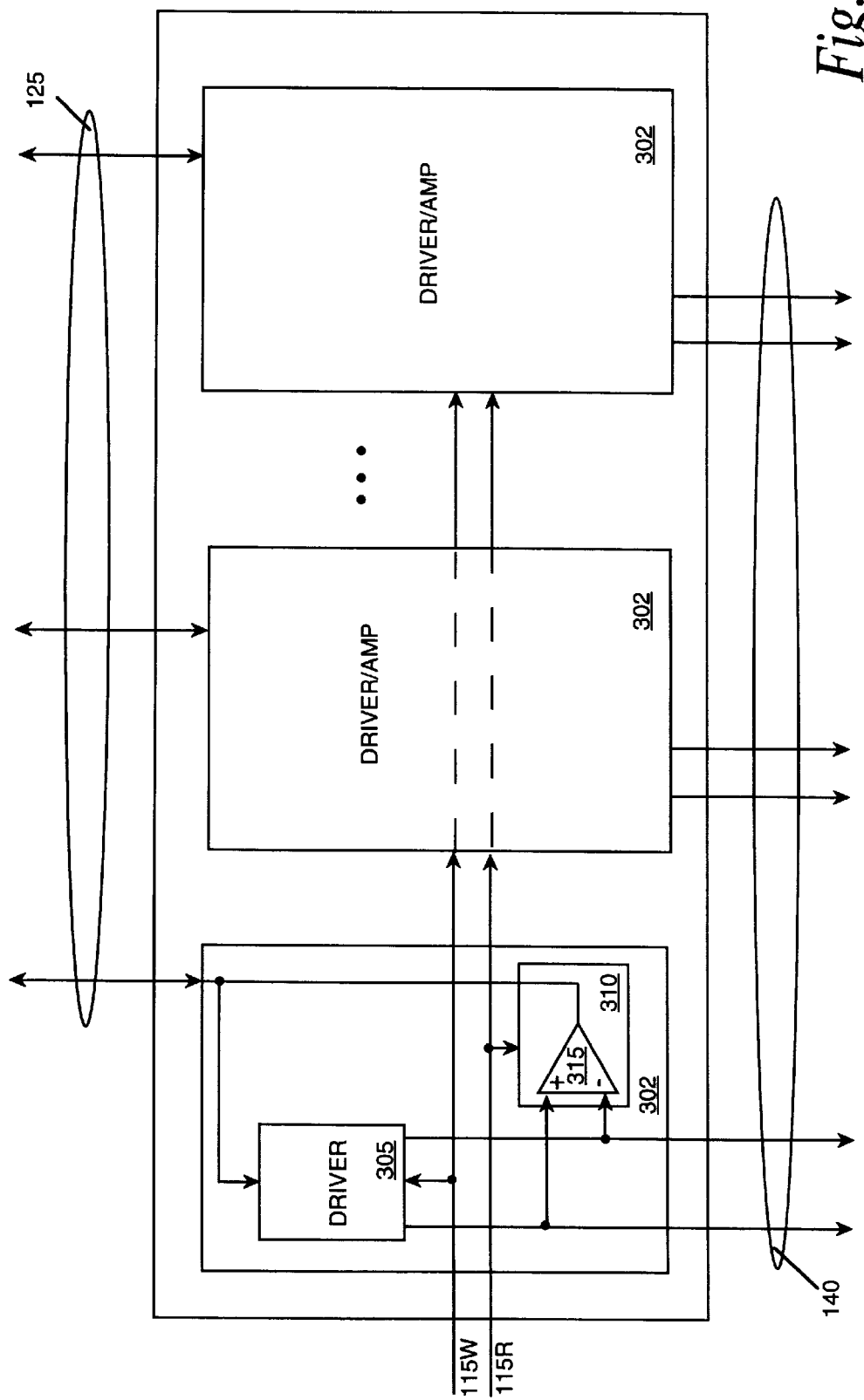
FIG. 3 is a block diagram of a memory I/O module, including a sense amplifier.

FIG. 3 is a block diagram of the memory I/O module 120 in greater detail. The I/O module 120 includes a plurality of driver/amplifiers 302. Each driver/amplifier 302 is connected to one of the lines of the data bus 125, a pair of the lines of the internal data bus 140, a write strobe line 115W and a read strobe line 115R. Each driver/amplifier 302 includes a driver 305 and a sense amplifier 310. The driver 305 is enabled when the write strobe line 115W is on. When enabled, the driver 305 sets the connected pair of lines of the internal data bus 140 in complementary states in accordance with the value on the connected line of the data bus 125. The sense amplifier 310 is enabled when the read strobe line 115R is on. When enabled, the sense amplifier 310 senses the conditions of the connected pair of lines of the internal data bus 140 and outputs an amplified signal on the connected line of the data bus 125 in accordance with the sensed values.

The sense amplifier 310 includes a differential amplifier 315, which operates in a saturation mode. In other words, the differential amplifier 315 operates as a comparator. As shown, the differential amplifier 315, if ideal, outputs a high signal if the top (+) input is greater than the bottom (−) input, or a low signal if the bottom (−) input signal is greater than the top (+) input signal. The differential amplifier 315 is able to sense slight differences between its inputs and provide a full strength output signal when the inputs are connected to weak signals. The sense amplifier 310 thus converts a differential signal to a single-ended signal. In alternate arrangements, the data bus 125 may consist of differential signals, and/or the internal data bus 140 may consist of single-ended signals. Thus, in alternate arrangements, the sense amplifier 310 may be any appropriate amplifier, e.g., single-ended to differential, single-ended to single-ended, or differential to differential.

One of the key parameters of the sense amplifier 310 is the offset voltage of the differential amplifier 315. In particular, the input offset voltage is a key parameter of the sense amplifier 310. The input offset voltage, as used herein, is the minimum difference between the voltages at the input terminals effective to cause the output signal to rail to a specified state. When offset voltage is taken into account, the operation of the differential amplifier 310 may be modeled according to the following equations:

$$OUT=0 \text{ if } IN-\rightarrow IN_+ + OFFSET_0;$$

$$OUT=1 \text{ if } IN+\rightarrow IN- + OFFSET_1.$$

In a symmetrical device, $OFFSET_0 = OFFSET_1$. Typical values for offset voltages is on the order of 100 mV (millivolts). The effect of the input offset voltage is to create a small dead zone for input values that are close in value. That is, small differences (less than the relevant offset) in input values are sensed erroneously by the differential amplifier 315. Only input signal differences larger than the relevant offset voltage are sensed correctly by the differential amplifier 315.

A large offset voltage for the differential amplifier 315 limits the speed at which the memory system 100 can operate. In particular, the access time for reading from the memory array 105 is constrained by the offset voltage of the differential amplifier 315. Before the connected bit lines can be sensed, the sense amplifier 310 must wait for the connected bit lines to generate the minimum offset voltage difference. This amount of time is dependent upon the slew rate of the connected memory cell 200. In some applications, the speed of the memory system 100 is critical. This is true when the memory system 100 is a cache memory between a microprocessor core and a computer main memory. In such cases where speed is to be maximized, it is important that the differential amplifier 315 have a minimal offset voltage.

Unfortunately, known techniques for characterizing the offset voltage of the sense amplifier 310 are approximate and unsatisfactory. Known techniques include calculations based on the electrical characteristics of the electronic components (most significantly FETs) of the differential amplifier 315 or rough "rules of thumb". Disadvantages of known techniques include (1) difficultly to accurately measure FET characteristics; (2) difficult, ambiguous or specious application of FET statistics; and (3) rules of thumb are too crude to fully optimize performance.

Figure 4:
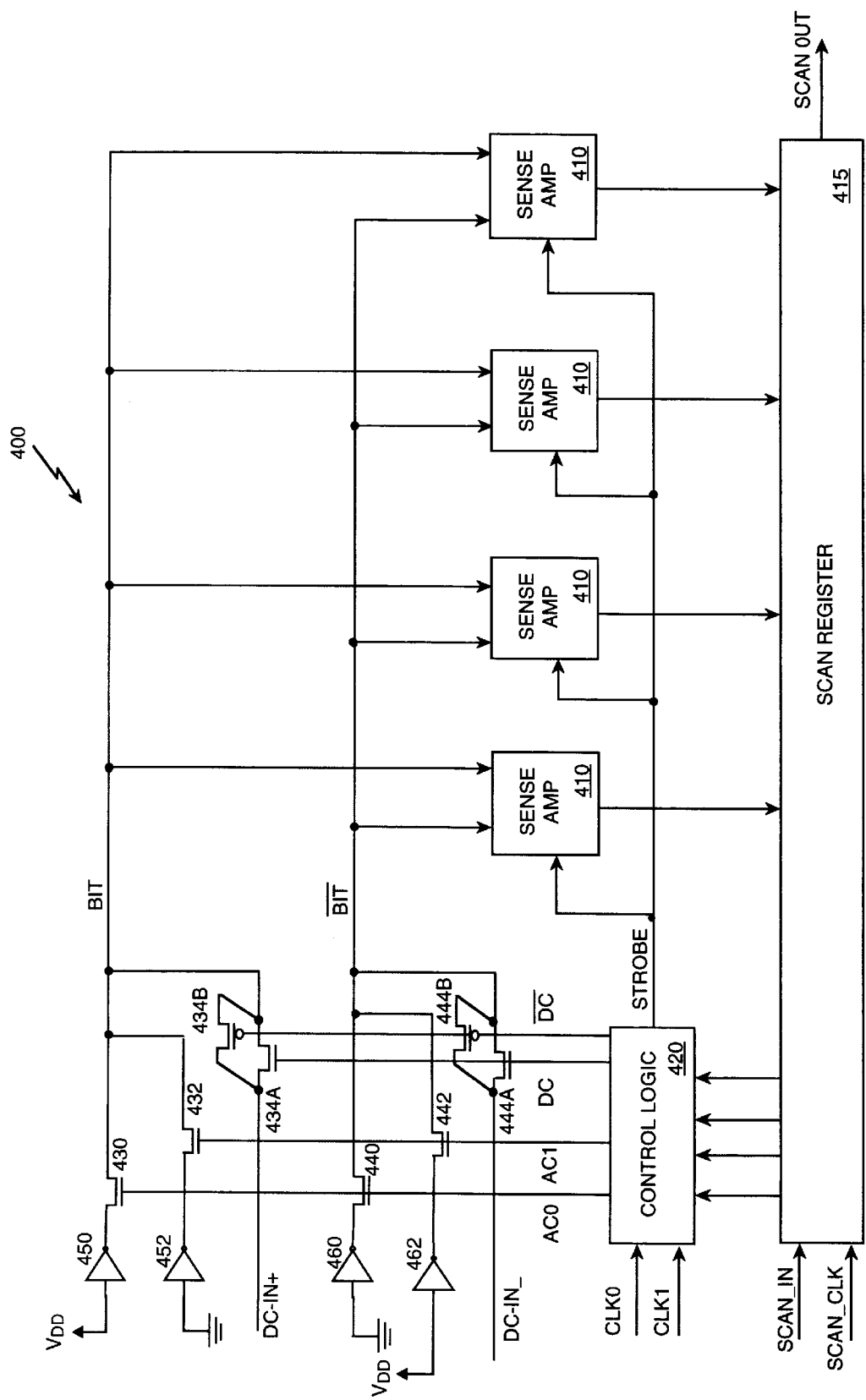
FIG. 4 is a block diagram of a sense amplifier characterization system according to one embodiment of the invention.

FIG. 4 is a block diagram of a sense amplifier characterization system 400 according to one embodiment of the invention. The sense amplifier characterization system 400 comprises a number of sense amplifiers 410 to be characterized, a scan register 415, a control logic 420, and a pair of simulated complementary bit lines BIT and /BIT (shown in the drawings with an overbar). The sense amplifier characterization system 400 additionally comprises a number of NFETs 430–434 and 440–444, connected to the control logic 420 so as to manipulate the simulated bit lines BIT and /BIT. The sense amplifier characterization system 400 is illustrated with four sense amplifiers 410 because four is a convenient number for illustration. However, the number of sense amplifiers 410 is largely arbitrary within the restraints of size, power consumption and other factors. The sense amplifiers 410 may be of the same or different designs.

The sense amplifier characterization system 400 is a testing platform. The sense amplifier characterization system 400 empirically determines characteristics, such as offset voltage, of the sense amplifiers 410. The sense amplifier characterization system 400 operates according to a scan testing principle. Configuration data is contained within a signal SCAN_IN, which is input to the scan register 415 (clocked by the signal SCAN_CLK) and then to the control logic 420. The configuration data establishes a testing mode for testing of the sense amplifiers 410. The outputs of the sense amplifiers 410 are recorded in the scan register 415. The contents of the scan register 415 are shifted or scanned out as a signal SCAN_OUT, which is a the configuration data defining the type of test (such as a copy of the SCAN_IN input) and the test results output from the sense amplifiers 410. The signal SCAN_IN is preferably supplied by and the signal SCAN_OUT is preferably connected to an optional separate tester (not shown), such as a computer controlled tester that systematically varies testing modes, records the results, and statistically analyzes the results.

The control logic 420 generally performs two functions. First, the control logic 420 manipulates the simulated bit lines BIT and /BIT by setting the values of three control lines AC0, AC1, DC and /DC. Second, the control logic 420 provides a strobe signal STROBE to the sense amplifiers 410 on the basis of two clock signals CLK0 and CLK1. The manipulation of the simulated bit lines BIT and /BIT is performed in two modes—DC mode and AC mode. In the DC mode, the control lines AC0 and AC1 are held low, causing FETs 430, 432, 440 and 442 to "turn off" (i. e. , open circuit between source and drain terminals). Then, in DC mode, the control line is set high, causing the NFETs 434A and 444A to "turn on" (i. e. , conduct from source to drain terminals). Meanwhile, the control signal /DC (shown in the drawings with an overbar) is set low, causing the PFETs 434B and 444B to "turn on". Thus, in the DC mode, the simulated bit lines BIT and /BIT are connected to the signals DC_IN$_+$ and DC_IN$_-$, respectively, which are set at predetermined voltage levels. When the strobe signal STROBE is pulsed, the sense amplifiers 410 produce outputs, which are either high or low, according to the voltage levels DC_IN$_+$ and DC_IN$_-$, as well as the offset voltages of the sense amplifiers 410, and these outputs are recorded in the scan register 415. Thus, the DC mode tests how well the sense amplifiers 410 sense the static condition where the inputs to the sense amplifier are DC_IN$_+$ and DC_IN$_-$, which could be equal and opposite, but not necessarily.

By manipulation of the values of DC_IN$_+$ and DC_IN$_-$, one can utilize the sense amp characterization system 400 to quantify several characteristics of the sense amplifiers 410. First, one can test the magnitude of differential discrimination possible with the sense amplifiers by varying the difference DC_IN$_+$–DC_IN$_-$. Second, one can test the sensitivity of the sense amplifiers 410 to asymmetry in the differential pair DC_IN$_+$ and DC$_{13}$ IN$_-$ by varying one of DC_IN$_+$ and DC_IN$_-$ without equal and opposite variations in the other. Third, one can test the performance of the sense amplifiers 410 over a common mode input range by adjusting both values of DC_IN$_+$ and DC_IN$_-$ up and/or down together while maintaining a fixed difference.

The sense amp characterization system 400 allows for methodical testing by repeated evaluations at various values of DC_IN$_+$ and DC_IN$_-$. Preferably, the tester incrementally and independently steps the values of DC_IN$_+$ and DC_IN$_-$ from 0 V (volts) to a maximum value in small steps, such as, for example, 5 mV (millivolts), and for each case repeats the DC test by pulsing the strobe signal STROBE and scanning out the signal SCAN_OUT.

In the AC mode, the control logic 420 forces the control line DC low and the control line /DC high. The control logic then manipulates the control lines AC0 and AC1 low. When AC0 is asserted, the FETs 430 and 440 turn on, slewing the simulated bit line BIT low and the simulated complement bit line /BIT high, as would be the case when reading a 0 (zero) from a memory cell. Similarly, when AC1 is asserted, the FETs 432 and 442 turn on, slewing the simulated bit line BIT high and the simulated complement bit line /BIT low, as would be the case when reading a 1 (one) from a memory cell.

The fact that the simulated pair of bit lines BIT and /BIT simulate the bit lines output from an actual memory cell can be better understood by comparing FIGS. 2 and 4. The control lines DC, AC0 and AC1 are like the word line 235 in the memory cell 200. The FETs 430A,432 and 434 are like the FET 220, and the FETs 440A, 442 and 444 are like the FET 215. The inverters 450 and 452 are like the inverter 205, and the inverters 460 and 462 are like the inverter 210. Finally, the strobe signal STROBE is like the read strobe line 115R. Roughly speaking, the circuitry in the upper left section of FIG. 4 is like the memory cell 200 "split apart". In other words, the pair of bit lines BIT and /BIT bear signals like an output of the memory cell 200.

Figure 5:
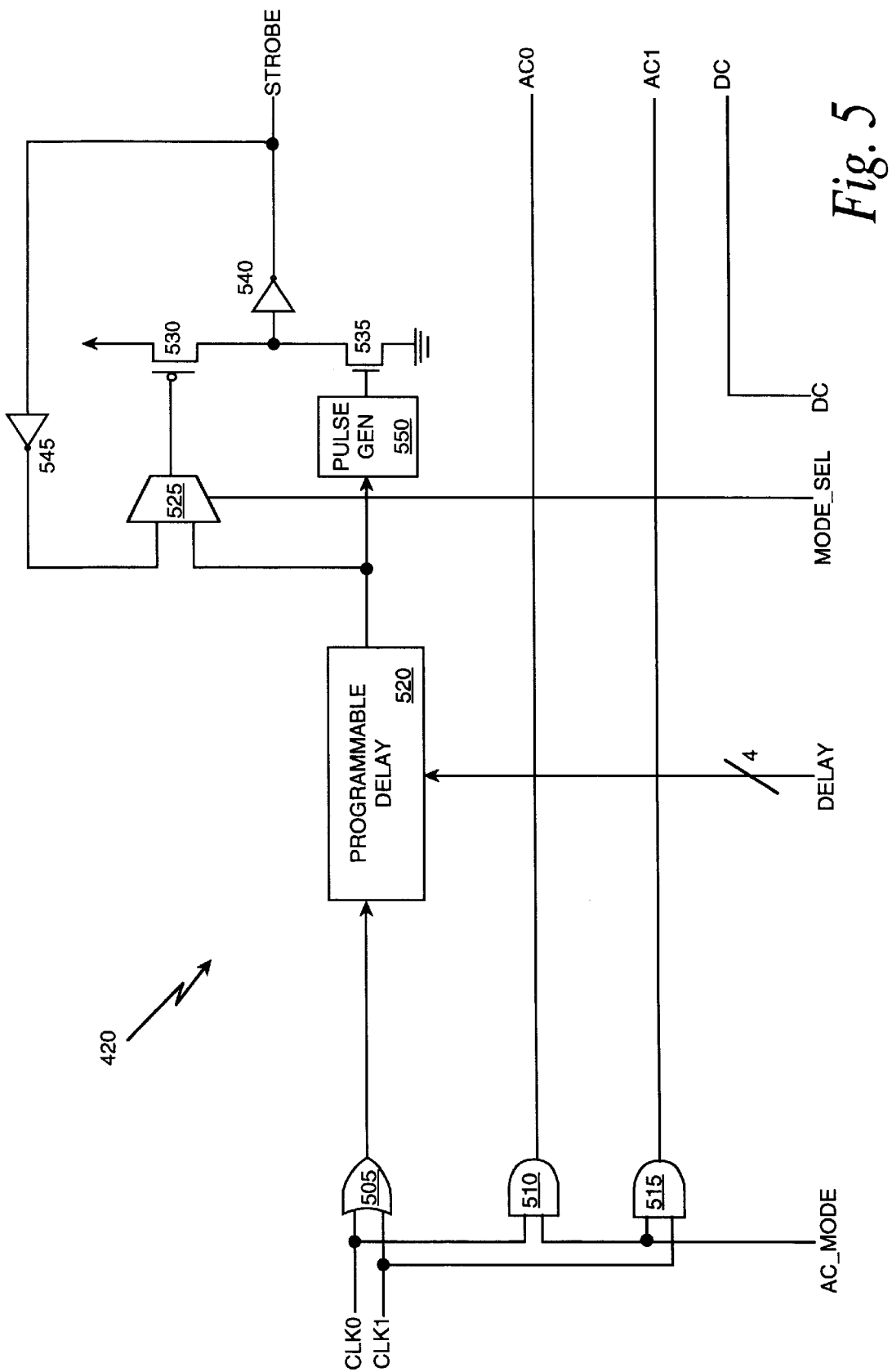
FIG. 5 is a circuit diagram of control logic in the sense amplifier characterization system of FIG. 4.

FIG. 5 is a circuit diagram of the control logic 420 in the sense amplifier characterization system 400. The control logic 420 comprises an OR gate 505, two AND gates 510 and 515, a programmable delay block 520, a multiplexor (MUX) 525, a PFET (P-channel FET) 530, an NFET 535, two inverters 540 and 545, and a pulse generator 550. Inputs to the control logic 420 from the scan register 415 comprise control signals AC_MODE, DELAY, MODE_SEL and DC. The clock signals CLK0 and CLK1 are input to the OR gate 505. The clock signals CLK0 and CLK1 are also respectively input to the AND gates 510 and 515. The control signal AC_MODE is also input to both AND gates 510 and 515. When AC_MODE is high, then AC0=CLK0 and AC1=CLK1. The output of the OR gate 505 is input to the programmable delay block 520, whose output is its input signal delayed by an amount based on the control bus DELAY, which may be 4 bits wide, for example, to provide 16 different delay values. The output of the programmable delay block 520 is input to the circuit formed by the MUX 525, PFET 530, NFET 535, inverters 540 and 545, and pulse generator 550, so as to produce the strobe signal STROBE. The operation of this circuit depends upon the control signal MODE_SEL.

When the value of the control signal MODE_SEL is such that the MUX 525 selects the top input, then the circuit is in a "pulse" mode. The pulse generator 550 generates a short pulse on the rising edge of the output of the programmable delay 520. The rising edge of the pulse from the pulse generator 550 turns on the NFET 535, which causes the strobe signal STROBE to go high by operation of the invertor 540. The high value of the strobe signal STROBE causes the output of the invertor 545 to go low, which via the MUX 525 is connected to the gate of the PFET 530. As a result of the low signal at the gate of the PFET 530, the PFET 530 turns on, causing the strobe signal STROBE to fall low. The circuit in the pulse mode has the effect of causing a pulse on the strobe signal STROBE, and this pulse is longer than the pulse generated by the pulse generator 550 due to gate delays and switching delays in the circuit.

When the value of the control signal MODE_SEL is such that the MUX 525 selects the bottom input, then the circuit is in a "clock" mode. In the clock mode, the rising edge of the pulse from the pulse generator 550 turns on the NFET 535, which causes the strobe signal STROBE to go high by operation of the invertor 540, just as in the pulse mode. In the clock mode, however, there is no feedback loop and the strobe signal STROBE stays high until the falling edge of the clock signal output from the programmable delay 520 hits the gate of the PFET 530.

Figure 6:
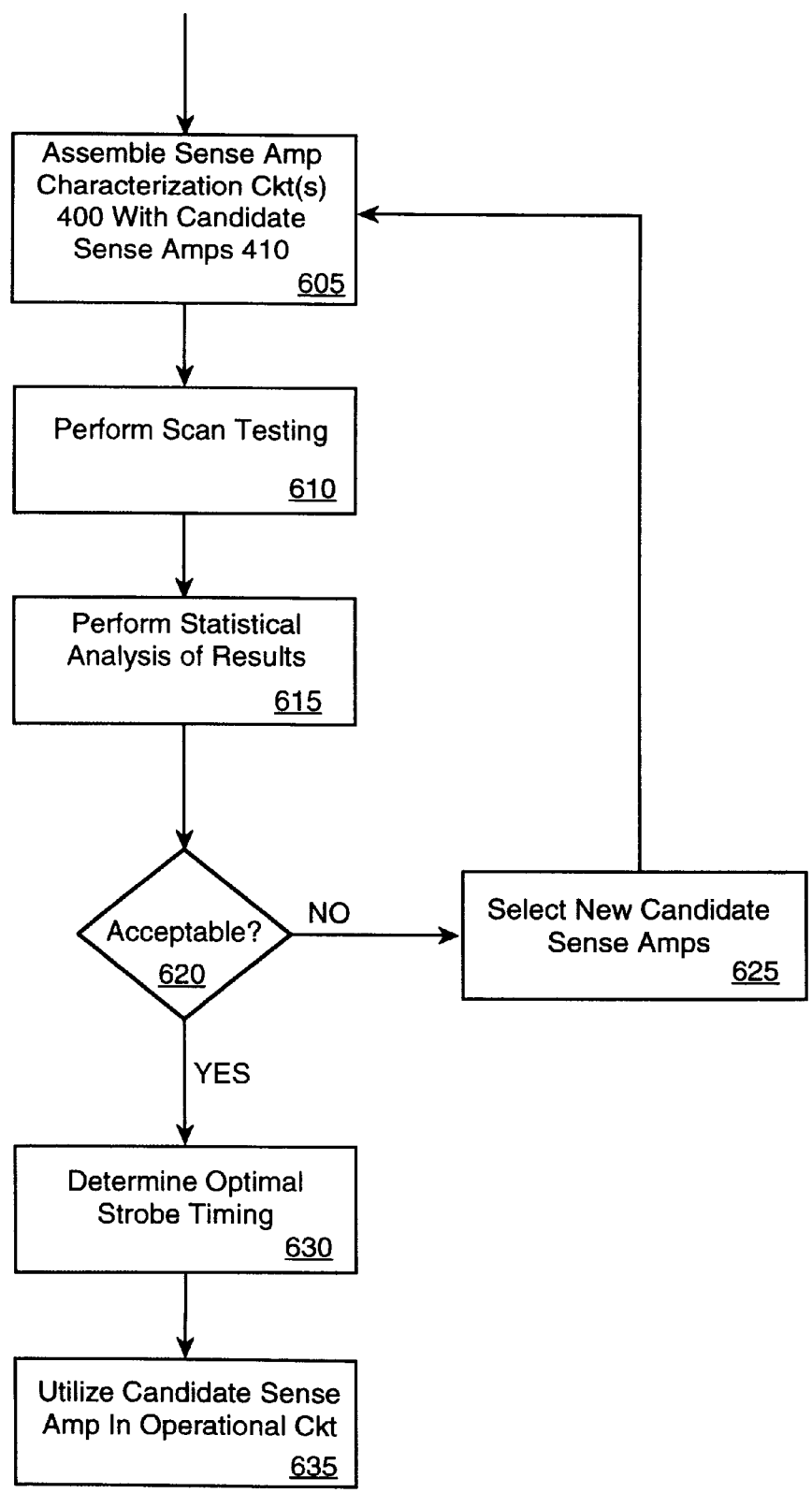
FIG. 6 is a flowchart of a method of using the sense amplifier characterization system of FIG. 4.

FIG. 6 is a flowchart of a method 600 of using the sense amplifier characterization circuit 400. The method 600 is useful for testing a design of a candidate sense amplifier and determining whether the candidate sense amplifier would be acceptable for full production and operational use. The method 600 begins by assembling (605) one or more sense amplifier characterization circuits 400 in which the sense amplifiers 410 are the candidate designs being characterized. The sense amplifier characterization circuit 400 is then operated by performing (610) scan testing of the candidate sense amplifiers, as described in detail above. The results of the scan testing are statistically analyzed (615) according to well known techniques. Preferably, the statistical analysis includes estimation of statistics related to the offset voltage of the candidate sense amplifiers. For example, estimates of the $3\sigma$ worst case (maximum) offset voltage (i.e., $V_{3\sigma}$ is that value such that the probability the offset voltage is less than $V_{3\sigma}$ is approximately 0.997) may be calculated. Such statistics are useful in predicting the yield of a production run of the candidate sense amplifiers. On the basis of the results of the statistical analysis, the method 600 tests (620) whether the candidate sense amps are acceptable or not. If not, new candidate sense amplifiers are designed or selected (625), and the method 600 repeats from the beginning using the new candidate sense amplifiers.

If the candidate sense amplifiers are acceptable, then the method 600 determines (630) optimal strobe timing for use with the candidate sense amplifiers and utilizes (635) the candidate sense amplifier in operational (as opposed to testing) circuits, such as the memory system 100 (FIG. 1). Timing optimization involves the determination of the appropriate amount of delay for the delay element 145. The appropriate delay can be computed in a straightforward manner as a function of the slew rate on the bit lines 240 and 245 (FIG. 2) and the offset voltage of the sense amplifier 410 (FIG. 4). The slew rate can be determined by simulations (such as SPICE®) according to techniques well known in the art. The offset voltage of sense amplifiers can be determined from the invention.

Preferably, the operational circuits and the sense amplifier characterization circuit(s) are fabricated under the same or similar processes and conditions to ensure high correlation between the two cases. Furthermore, the fabrication or assembly process (615) applied to the candidate sense amplifiers utilizes the same equipment and materials as that applied to the resulting sense amplifiers fabricated in full production. To better estimate worst case performance, the fabrication or assembly process (615) applied to the candidate sense amplifiers can be purposefully skewed to simulate aging and future drift of the fabrication equipment and process. Furthermore, aging and deterioration of the semiconductor circuits making up the sense amplifiers can also be purposefully skewed.

The terms and descriptions used herein are set forth by way of illustration only and are not meant as limitations. Those skilled in the art will recognize that many variations are possible within the spirit and scope of the invention as defined in the following claims, and their equivalents, in which all terms are to be understood in their broadest reasonable sense unless otherwise indicated.

What is claimed is:

1. A system for characterizing a sense amplifier, the system comprising:

a sense amplifier having one or more inputs and an output;

a BIT line connected to one of the one or more inputs and an output;

a register connected to the output of the sense amplifier; and a control logic connected to the BIT line and the register.

2. The system of claim 1 wherein the register is further connected to the control logic.

3. The system of claim 1 wherein the register is a scan register.

4. The system of claim 3 further comprising:

a tester connected to the scan register.

5. The system of claim 1 wherein the sense amplifier is a differential sense amplifier, and the system further comprises:

a complement BIT line connected to one of the one or more inputs of the sense amplifier.

6. The system of claim 1 wherein one or more clock signals connect to the control logic, and the control logic generates a strobe signal on the basis of the one or more clock signals, and the strobe signal is connected to the sense amplifier.

7. The system of claim 1 further comprising:

one or more switching devices connected to the BIT line, the control logic and one or more respective predetermined logic states, wherein the control logic is capable of turning on the one or more switching devices so as to force the BIT line to a predetermined logic state.

8. A system for characterizing a sense amplifier, the system comprising:

a means for amplifying one or more inputs to produce an output;

a means, connected to one of the one or more inputs of the means for amplifying, for simulating an output of a memory array;

a means for latching the output of the amplifying means; and a means for controlling the means for simulating, wherein the means for latching is further connected to the means for controlling.

9. The system of claim 8 wherein the means for latching is further connected to the means for controlling.

10. The system of claim 8 wherein the means for latching is a scan register.

11. The system of claim 10 further comprising:

a means for testing, connected to the scan register.

12. The system of claim 8 further comprising:

a means, connected to one of the one or more inputs of the means for amplifying, for simulating a complement output of a memory array; and wherein the means for amplifying is a means for differentially amplifying the means for simulating an output of a memory array and the means for simulating a complement output of a memory array.

13. The system of claim 12 wherein the means for simulating an output of a memory array comprises:

one or more means for switching, connected to the means for controlling and one or more respective predetermined logic states, wherein the means for controlling is capable of turning on the one or more means for switching so as to force the means for simulating an output of a memory array to a predetermined logic state.

14. The system of claim 8 wherein the means for controlling comprises:

means for strobing the means for amplifying.

15. A method for characterizing a sense amplifier, the method comprising:

producing one or more signals like and output of a memory cell;

slewing the one or more signals;

operating a sense amplifier to produce an output state on the basis of the one or more signals; and recording the one or more output states.

16. The method of claim 15 further comprising:

recording data related to the one or more signals.

17. The method of claim 15 wherein the producing step comprises:

setting a voltage of the one or more signals to be a static value during the operating step.

18. The method of claim 15 wherein the producing step comprises:

slewing the one or more signals like an output of a memory cell.

19. The method of claim 15 further comprising:

determining, on the basis of the output state, whether the sense amplifier is acceptable.

20. The method of claim 19 further comprising utilizing the sense amplifier with a memory system, if the sense amplifier is acceptable.

* * * * *